(12) United States Patent
Kim et al.

(10) Patent No.: US 7,682,904 B2
(45) Date of Patent: Mar. 23, 2010

(54) METHOD OF FABRICATING FLASH MEMORY DEVICE

(75) Inventors: Eun Soo Kim, Incheon (KR); Jung Geun Kim, Seoul (KR); Suk Joong Kim, Kyeongki-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 107 days.

(21) Appl. No.: 12/131,626

(22) Filed: Jun. 2, 2008

(65) Prior Publication Data

US 2009/0023279 A1 Jan. 22, 2009

(30) Foreign Application Priority Data

Jul. 18, 2007 (KR) .................. 10-2007-0071643

(51) Int. Cl.
*H01L 21/8234* (2006.01)

(52) U.S. Cl. .................. 438/260; 438/265; 438/422; 257/E21.209; 257/E21.581; 257/E21.573

(58) Field of Classification Search .......... 438/265, 438/422, 260; 257/E21.581, E21.209, E21.573
See application file for complete search history.

(56) References Cited

U.S. PATENT DOCUMENTS 5,880,008 A * 3/1999 Akiyama et al. ............ 438/444
2004/0238847 A1* 12/2004 Sugimae et al. ............ 257/200

* cited by examiner

*Primary Examiner*—Davienne Monbleau
*Assistant Examiner*—Matthew Reames
(74) *Attorney, Agent, or Firm*—Marshall, Gerstein & Borun LLP

(57) ABSTRACT

The present invention relates to a method of fabricating a flash memory device and includes forming an air-gap having a low dielectric constant between word lines and floating gates. Further, a tungsten nitride (WN) layer is formed on sidewalls of a tungsten (W) layer for a control gate. Hence, the cross section of the control gate that is finally formed can be increased while preventing abnormal oxidation of the tungsten layer in a subsequent annealing process. The method of the present invention can improve interference between neighboring word lines and, thus improve the reliability of a device. Accordingly, a robust high-speed device can be implemented.

20 Claims, 3 Drawing Sheets

METHOD OF FABRICATING FLASH MEMORY DEVICE

CROSS-REFERENCES TO RELATED APPLICATION

The priority of Korean Patent Application Number 10-2007-0071643, filed on Jul. 18, 2007, is hereby claimed and the disclosure thereof is incorporated herein by reference in its entirety.

BACKGROUND OF THE INVENTION

The present invention relates to a method of fabricating a flash memory device and, more particularly, to a method of fabricating a flash memory device that can improve an interference phenomenon between neighboring word lines and prevent abnormal oxidization of a conductive layer for a control gate.

A flash memory device is a memory device that can retain its data when power is off. This flash memory device is equipped with a charge trap layer in which charges are trapped in order to cause a threshold voltage (Vth) difference between the gate and the channel. The threshold voltage (Vth) is varied depending on a state (a program state or an erase state in which electrons are discharged) in which charges are injected into the charge trap layer. Thus, a gate voltage (Vg) for turning on the channel is varied. The operation of the flash memory device is implemented based on the concept that the threshold voltage (Vth) is changed depending on charges trapped or stored in the charge trap layer.

Recently, as a high speed of a device is required in line with higher integration of the device, a control gate is formed using a tungsten (W) layer with a low resistivity. Formation of the control gate using the tungsten layer causes abnormal oxidization of the tungsten layer during a subsequent annealing process. The abnormal oxidization is caused by a reaction between the tungsten (W) in the tungsten layer and the oxygen in an oxide layer of the spacer. Such abnormal oxidization of the tungsten layer becomes a significant problem in securing the reliability of a device after the process is finished.

Further, as devices are more highly integrated, the width of isolation layers is narrowed and a distance between neighboring word lines and between neighboring floating gates is reduced. An interference capacitor in the word line direction, the bit line direction, and the like causes an interference that deepens the shift of the cell threshold voltage, making normal cell operation difficult. An insulating layer between floating gates is generally formed of an oxide layer having a dielectric constant of 4.2. However, it is difficult to lower the capacitance value in order to form spacers. Using a material having a low dielectric constant instead of the oxide layer does not solve the fundamental problem and is difficult to implement.

BRIEF SUMMARY OF THE INVENTION

The present invention is directed towards a method of fabricating a flash memory device, which can have one or more benefits, such as improving interference between neighboring word lines, preventing abnormal oxidization of a conductive layer for a control gate, and implementing a robust high-speed device.

A method of fabricating a flash memory device in accordance with an aspect of the present invention includes providing a semiconductor substrate in which a tunnel dielectric layer, a first conductive layer, a dielectric layer, and a second conductive layer are formed, patterning the second conductive layer and the dielectric layer, forming an anti-oxidization layer over the first conductive layer, including the patterned second conductive layer and the patterned dielectric layer, etching the anti-oxidization layer, while etching the first conductive layer, in such a manner that the anti-oxidization layer remains on sidewalls of the second conductive layer and the first conductive layer is patterned, forming a first insulating layer having an overhang shape on its top while surrounding each element of the remaining anti-oxidization layer, and forming a second insulating layer having an air-gap between the first insulating layers on the sidewalls of adjacent elements of the patterned first conductive layer.

The second conductive layer can be formed of a tungsten (W) layer. The anti-oxidization layer can be formed of a tungsten nitride (WN) layer. The anti-oxidization layer can be formed using a Chemical Vapor Deposition (CVD) or a Physical Vapor Deposition (PVD) method. The anti-oxidization layer can be formed to a thickness in a range of 80 to 100 angstrom, for example by using the CVD method. The anti-oxidization layer can be formed to a thickness in a range of 200 to 300 angstrom, for example by using the PVD method. The anti-oxidization layer can remain at a thickness in a range of 20 to 50 angstrom on the sidewalls of the second conductive layer. The first insulating layer can be formed of an insulating layer having a poor gap-filling characteristic.

The insulating layer having a poor gap-filling characteristic can include an Ozone-Tetra Ortho Silicate Glass ($O_3$-TEOS) layer or an Undoped Silicate Glass (USG) layer. The first insulating layer can be formed to a thickness in a range of 300 to 500 angstrom, for example by using the CVD method. The second insulating layer can be formed of a High Density Plasma (HDP) oxide layer.

If the overhang shape come in contact with an overhang shape formed on an adjacent element of the remaining anti-oxidization layer when the first insulating layer is formed, an additional etch process can be further performed in order to partially remove the overhang shapes. A barrier layer can be formed on the dielectric layer before the second conductive layer is formed. The barrier layer can be formed of a tungsten nitride (WN) layer. A hard mask can be formed on the second conductive layer before the second conductive layer is patterned. The hard mask can be formed of material that does not react with the second conductive layer at the time of annealing. When the first conductive layer is patterned, the hard mask can partially remain.

An annealing process can be further performed after the second insulating layer is formed. The tungsten nitride (WN) layer of the anti-oxidization layer and the barrier layer that remain after the annealing process is completed can be changed into a tungsten layer to increase a cross section of the second conductive layer.

BRIEF DESCRIPTION OF THE DRAWINGS

For a more complete understanding of the disclosure, reference should be made to the following detailed description and accompanying drawings.

DESCRIPTION OF SPECIFIC EMBODIMENTS

Now, specific embodiments according to the present invention will be described with reference to the accompanying drawings. However, the present invention is not limited to the disclosed embodiments, but can be implemented in various manners. The embodiments are provided to complete the disclosure of the present invention and to allow those having ordinary skill in the art to understand the present invention. The present invention is defined by the category of the claims.

FIGS. 1A to 1G are sectional views showing a method of fabricating a flash memory device in accordance with an embodiment of the present invention.

Figure 1A:
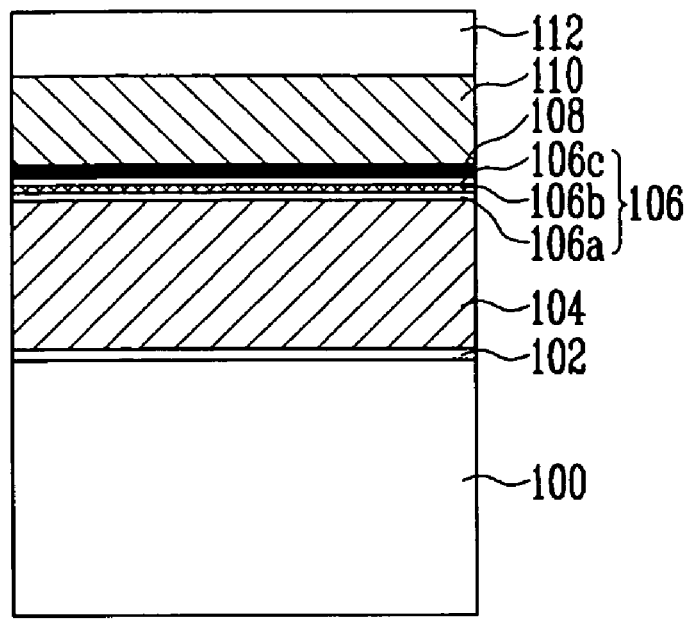
FIGS. 1A to 1G are sectional views showing a method of fabricating a flash memory device in accordance with an embodiment of the present invention.

Referring to FIG. 1A, a tunnel dielectric layer 102 and a first conductive layer 104 are formed over a semiconductor substrate 100. The tunnel dielectric layer 102 can be formed, for example, of a silicon oxide ($SiO_2$) layer. In this embodiment, an oxidation process can be used to form the tunnel dielectric layer 102. The first conductive layer 104 can be used as a floating gate and can be formed, for example, of a polysilicon layer, a metal layer, or a stacked layer of them. Preferably, a polysilicon layer is used.

An etch process employing a mask (not shown) is performed to pattern the first conductive layer 104 and the tunnel dielectric layer 102 in the isolation region in one direction (a bit line direction), exposing the semiconductor substrate 100 in the isolation region. The semiconductor substrate 100 exposed in the isolation region is etched to a specific depth to form trenches (not shown).

An insulating layer is formed by depositing insulating material over the semiconductor substrate 100 including the trenches, such that the trenches are gap-filled. A polishing process is then performed to form isolation layers (not shown) in the trench regions. Thereafter, an additional etch process can be performed in order to control the Effective Field Oxide Height (EFH) of the isolation layers.

A dielectric layer 106, a barrier layer 108, a second conductive layer 110, and a hard mask 112 are sequentially formed over the semiconductor substrate 100 including the first conductive layer 104 and the isolation layers. The dielectric layer 106 can have, for example, an Oxide-Nitride-Oxide (ONO) stacked layer structure formed of a first oxide layer 106a, a nitride layer 106b, and a second oxide layer 106c. The second conductive layer 110 can be used as a control gate and can be formed of a tungsten (W) layer, for example in order to implement a high-speed device and improve an interference phenomenon between neighboring cells. The barrier layer 108 is to be used as a barrier for forming the second conductive layer 110 and can be formed, for example, of a tungsten nitride (WN) layer. In this embodiment, the barrier layer 108 and the second conductive layer 110 preferably are formed using a PVD method. After the barrier layer 108 is formed, the second conductive layer 110 can be formed in-situ.

The hard mask 112 can prevent etch damage to the second conductive layer 110 during a subsequent gate etch process. The hard mask 112 can be formed of material that does not react with the second conductive layer 110, e.g. a tungsten layer for a control gate, during annealing. For example, the hard mask 112 can be formed of silicon oxynitride (SiON).

Figure 1B:
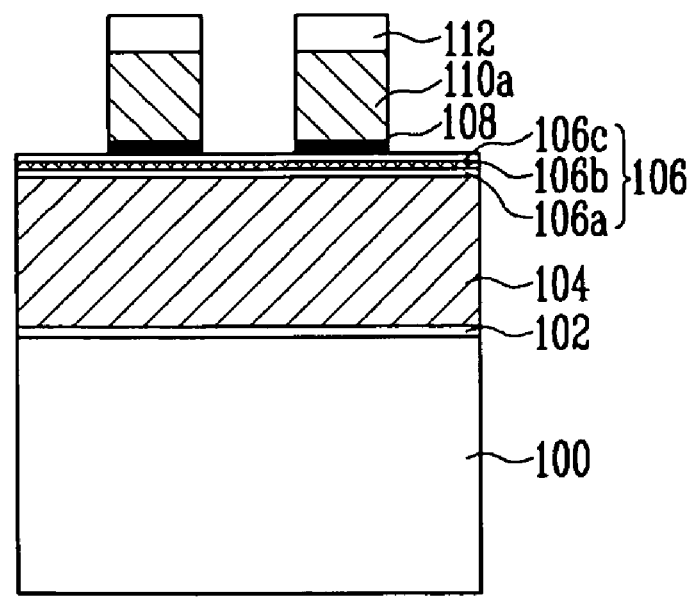

Referring to FIG. 1B, the hard mask 112, the second conductive layer 110, and the barrier layer 108 are patterned in a direction crossing the isolation layers by performing an etch process employing a mask (not shown). The patterning may expose the dielectric layer 106. Thus, a control gate 110a comprised of the second conductive layer 110 is formed. The control gates 110a of cells formed in different strings are interconnected to form word lines. In the etch process, the hard mask 112 can also be etched to a specific thickness.

Figure 1C:
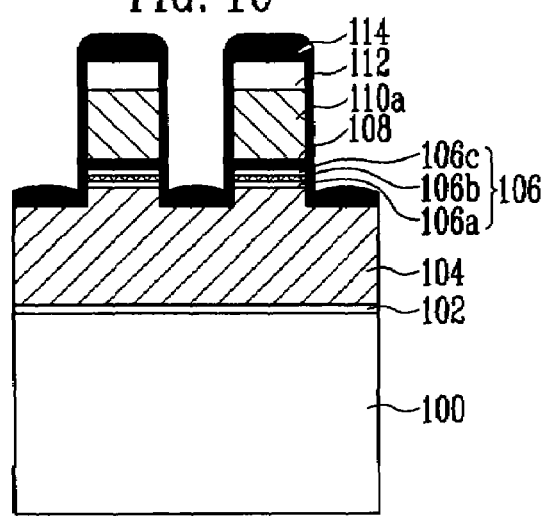

Referring to FIG. 1C, the exposed dielectric layer 106 is patterned by an etch process to expose the first conductive layer 104. Meanwhile, in the etch process, the first conductive layer 104 can also be partially etched.

An anti-oxidization layer 114 is formed on the first conductive layer 104 including the dielectric layer 106, the barrier layer 108, the control gate 110a, and the hard mask 112. The anti-oxidization layer 114 can prevent abnormal oxidization of the control gate 110a, which is caused by a reaction, during an annealing process, between the tungsten (W) of the control gate 110a and the oxygen of a subsequently formed spacer having an oxide layer. The anti-oxidization layer 114 can be formed, for example, of a tungsten nitride (WN) layer.

The tungsten nitride (WN) layer can be formed, for example, using a CVD or PVD method. The anti-oxidization layer 114, e.g. a tungsten nitride layer can be formed to a thickness sufficient to remain on the sidewalls of the control gate 110a to protect the control gates 110a after a subsequent gate etch process is completed. For example, the anti-oxidization layer 114 can be deposited to a thickness in a range of 80 to 100 angstrom when the CVD method is used, and to a thickness in a range of 200 to 300 angstrom when the PVD method is used.

Figure 1D:
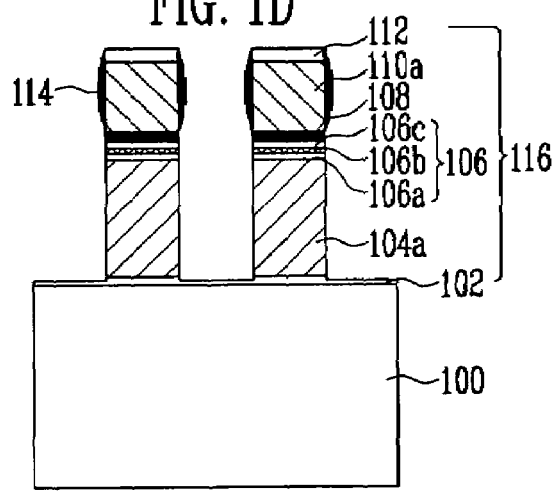

Referring to FIG. 1D, the first conductive layer 104 is patterned by performing an etch process using the anti-oxidization layer 114 as an etch mask to form a floating gate 104a that includes the first conductive layer 104. The surface of the tunnel dielectric layer 102 can be exposed by the patterning. A gate pattern 116 that includes the tunnel dielectric layer 102, the floating gate 104a, the dielectric layer 106, the barrier layer 108, the control gate 110a, and the hard mask 112 is also formed.

In this embodiment, the anti-oxidization layer 114 preferably remains, in spacer form, on the sidewalls of the control gates 110a while patterning the first conductive layer 104. The anti-oxidization layer 114 that remains on the sidewalls of the control gate 110a can have a thickness in a range of 20 to 50 angstrom. The anti-oxidization layer 114 that remains on the sidewalls of the control gate 110a can prevent abnormal oxidization of the control gate 110a during a subsequent annealing process.

In the process of patterning the first conductive layer 104, the hard mask 112 can also be etched. The hard mask 112 partially remain in order to prohibit abnormal oxidization of the control gate 110 caused by a reaction, during an annealing process, between the tungsten (W) in the control gate 110a and the oxygen of the subsequently formed spacer having an oxide layer.

Figure 1E:
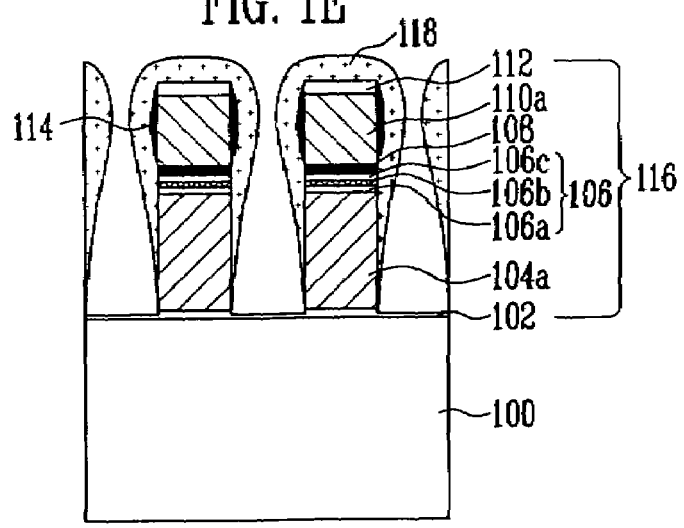

Referring to FIG. 1E, a first insulating layer 118 for spacers is formed to have an overhang shape while surrounding a top surface of the gate pattern 116. The first insulating layer 118 can be formed to a thickness in a range of 300 to 500 angstrom. An air-gap 122 within a subsequently formed insulating layer between neighboring word lines can be formed by using a first insulating layer 118 formed of an insulating layer material having a poor gap-filling characteristic. The first insulating layer 118 can be formed, for example, of an $O_3$-TEOS layer or a USG layer. In this embodiment, the first insulating layer 118 preferably is formed using a CVD method.

A deposition rate is faster at the top of the gate pattern 116 than at the semiconductor substrate 100 due to the material having a poor gap-filling characteristic. Hence, an overhang shape can be formed at the top of the first insulating layer 118 while the first insulating layer 118 is deposited. The overhang shape causes the first insulating layer 118 to have a negative slope, which can potentially degrade a subsequent gap-fill characteristic.

An insulating layer for spacers has to be additionally deposited subsequently. Thus, it is preferred that in order to secure a deposition entry, the overhang shape of the first insulating layer 118 formed on an element of the gate pattern 116 does not come in contact with an overhang shape of the first insulating layer 118 formed on an adjacent element of the gate pattern 116. The first insulating layer 118 can be formed to a thickness of 300 to 500 angstrom. However, when the overhang shapes come in contact with each other, the first insulating layer 118 can be partially etched by an additional etch process in order to partially remove the overhang shapes and open a deposition entry for deposition of a second insulating layer 120.

Figure 1F:
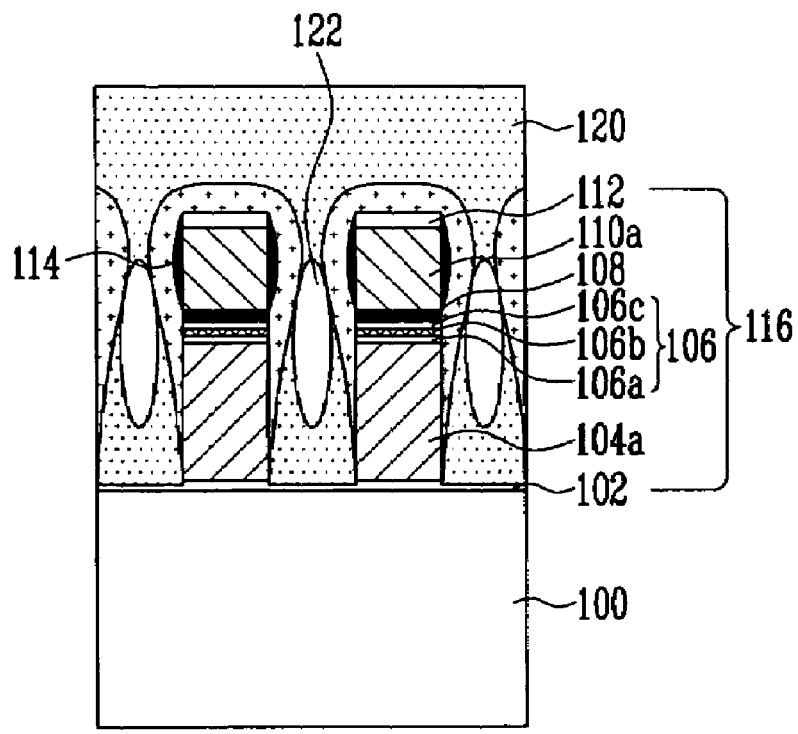

Referring to FIG. 1F, a second insulating layer 120 for spacers is formed by depositing an insulating material over the semiconductor substrate 100 including the first insulating layer 118 having the overhang shape. The second insulating layer 120 can be formed, for example, using an oxide layer, preferably, a HDP oxide layer employing a HDP method.

If the second insulating layer 120 is formed between the gate patterns 116 through the deposition entry narrowed by the overhang, an air-gap 122 is formed within the second insulating layer 120 between elements of the gate pattern 116. The air-gap 122 is formed between the first insulating layers 118 on sidewalls of neighboring floating gates 104a.

In general, the dielectric constant of the oxide layer is approximately 4.2, whereas the dielectric constant of air is 1.0. Thus, if the air-gap 122 having a low dielectric constant of 1.0 is formed between the gate patterns 116 (for example, the floating gate 104a and the word line), interference capacitance between neighboring word lines is reduced and, therefore, an interference effect between neighboring word lines can be improved.

A subsequent fabrication process of a flash memory device generally includes an annealing process performed at high temperature. In this embodiment, the annealing process is preferably performed after the second insulating layer 120 is formed or subsequent other processes are performed. The flash memory device after the annealing process is completed is described below with reference to the accompanying drawings.

Figure 1G:
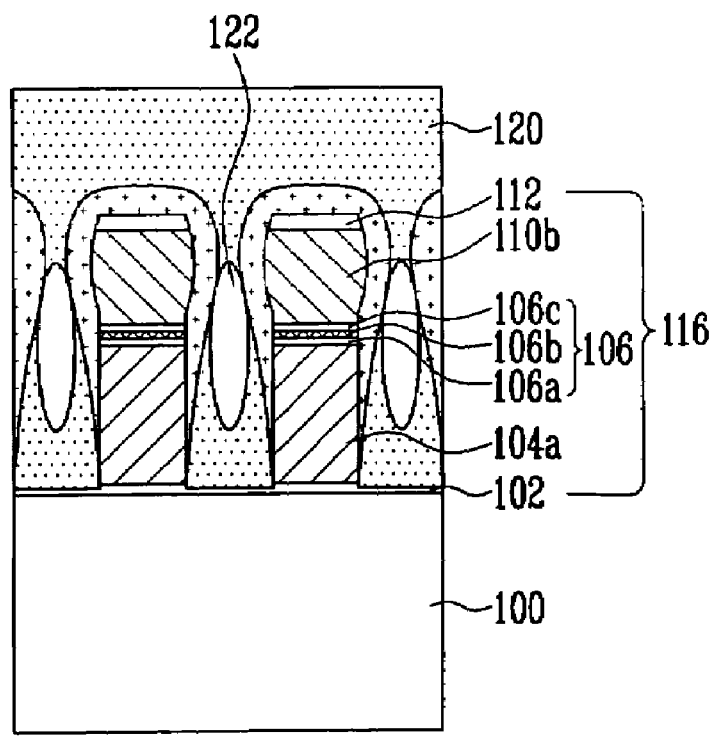

Referring to FIG. 1G, the flash memory device having the structure as shown in FIG. 1F can prevent abnormal oxidization of the control gate 110a by preventing a reaction, during the annealing process, between the tungsten (W) in the control gate 110a and the oxygen in the first insulating layer 118. Diffusion of nitrogen ($N_2$) within the anti-oxidization layer 114 to the outside during the annealing performed at a high temperature of 700 to 1000 degrees Celsius can prevent the abnormal oxidization of the control gate 110a. Consequently, the reliability of the device can be improved and a robust device can be implemented.

Further, as nitrogen ($N_2$) within the anti-oxidization layer 114 and the barrier layer 108 is diffused to the outside during the annealing process, the anti-oxidization layer 114 and the barrier layer 108 can be changed into a tungsten (W) layer. Accordingly, a final control gate 110b that is formed after the annealing process has an increased cross section occupied by the tungsten (W) layer, which can aid in implementing a high-speed device.

As described above, in accordance with an embodiment of the present invention, the air-gap having a low dielectric constant is formed within the oxide layer for spacers between the word lines and the floating gates, so interference between neighboring word lines can be improved. Accordingly, a high-speed device can be implemented.

Further, the tungsten nitride (WN) layer is formed on the sidewalls of the tungsten (W) layer for the control gate. Hence, the cross section of the control gate that is finally formed can be increased while preventing abnormal oxidization of the tungsten layer in a subsequent annealing process. Accordingly, the reliability of a device can be improved and a robust high-speed device can be implemented.

Further, when forming the barrier layer using the tungsten nitride (WN) layer below the tungsten (W) layer for the control gate, the tungsten nitride (WN) layer is changed into the tungsten layer in a subsequent annealing process. Accordingly, the cross section of the control gate that is finally formed can be increased. Accordingly, a higher-speed device can be implemented.

The embodiments disclosed herein have been proposed to allow a person skilled in the art to easily implement the present invention, and the person skilled in the part may implement the present invention by a combination of these embodiments. Therefore, the scope of the present invention is not limited by or to the disclosed embodiments, but can be implemented in various manners. The present invention is defined only by the appended claims and their equivalents.

What is claimed is:

1. A method of fabricating a flash memory device, comprising:
   providing a semiconductor substrate in which a tunnel dielectric layer, a first conductive layer, a dielectric layer, and a second conductive layer are formed;
   patterning the second conductive layer and the dielectric layer;
   forming an anti-oxidization layer over the first conductive layer, including the patterned second conductive layer and the patterned dielectric layer;
   etching the anti-oxidization layer, while etching the first conductive layer, in such a manner that the anti-oxidization layer remains on sidewalls of the second conductive layer and the first conductive layer is patterned;
   forming a first insulating layer surrounding each element of the remaining anti-oxidization layer and having a top with an overhang shape; and
   forming a second insulating layer having an air-gap between the first insulating layer on sidewalls of adjacent elements of the patterned first conductive layer.

2. The method of claim 1, comprising forming the second conductive layer of a tungsten (W) layer.

3. The method of claim 1, comprising forming the anti-oxidization layer of a tungsten nitride (WN) layer.

4. The method of claim 3, comprising forming the anti-oxidization layer using a Chemical Vapor Deposition (CVD) or a Physical Vapor Deposition (PVD) method.

5. The method of claim 4, comprising forming the anti-oxidization layer to a thickness in a range of 80 to 100 angstrom using a CVD method.

6. The method of claim 4, comprising forming the anti-oxidization layer to a thickness in a range of 200 to 300 angstrom using a PVD method.

7. The method of claim 1, comprising etching the anti-oxidization layer in such a manner that it remains at a thickness in a range of 20 to 50 angstrom on the sidewalls of the second conductive layer.

8. The method of claim 1, comprising forming the first insulating layer of an insulating layer material having a poor gap-filling characteristic.

9. The method of claim 8, wherein the first insulating layer material having a poor gap-filling characteristic includes an $O_3$-TEOS (Tetra Ortho Silicate Glass) layer or a USG (Undoped Silicate Glass) layer.

10. The method of claim 8, comprising forming the first insulating layer to a thickness in a range of 300 to 500 angstrom using a CVD method.

11. The method of claim 1, comprising forming the second insulating layer of a High Density Plasma (HDP) oxide layer.

12. The method of claim 1, wherein the overhang shape formed on an element of the remaining anti-oxidization layer comes in contact with an overhang shape formed on an adjacent element of the remaining anti-oxidization layer when the first insulating layer is formed, and further comprising performing an additional etch process in order to partially remove a portion of the overhang shapes.

13. The method of claim 1, further comprising forming a barrier layer on the dielectric layer before forming the second conductive layer.

14. The method of claim 13, comprising forming the barrier layer of a tungsten nitride (WN) layer.

15. The method of claim 1, further comprising forming a hard mask on the second conductive layer before patterning the second conductive layer.

16. The method of claim 15, comprising forming the hard mask of a material that does not react with the second conductive layer during annealing.

17. The method of claim 15, comprising patterning the first conductive layer in such a manner that the hard mask partially remains.

18. The method of claim 1, further comprising performing an annealing process after forming the second insulating layer.

19. The method of claim 18, further comprising forming a barrier layer on the dielectric layer before forming the second conductive layer, wherein the barrier layer is formed of a tungsten nitride (WN) layer; and forming the anti-oxidization layer of a tungsten nitride (WN) layer.

20. The method of claim 19, further comprising changing the tungsten nitride (WN) layer of the anti-oxidization layer and the barrier layer that remain after the annealing process is completed into a tungsten layer, so a cross section of the second conductive layer is increased.

* * * * *